United States Patent
Wang et al.

(10) Patent No.: US 8,659,029 B2
(45) Date of Patent: Feb. 25, 2014

(54) LOW CONTACT RESISTANCE SEMICONDUCTOR STRUCTURE AND METHOD OF FABRICATING THE SAME

(75) Inventors: Te-Chung Wang, Hsinchu (TW); Fu-Bang Chen, Hsinchu (TW); Hsiu-Mu Tang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/301,298

(22) Filed: Nov. 21, 2011

(65) Prior Publication Data

US 2012/0241752 A1  Sep. 27, 2012

(30) Foreign Application Priority Data

Mar. 22, 2011 (TW) .............................. 100109640 A

(51) Int. Cl.
*H01L 33/00* (2010.01)
(52) U.S. Cl.
USPC ........ 257/76; 257/96; 257/103; 257/E21.172; 257/E33.023; 257/E33.025; 438/23; 438/46; 438/510
(58) Field of Classification Search
None
See application file for complete search history.

(56) References Cited

U.S. PATENT DOCUMENTS

| 2008/0067497 A1* | 3/2008 | Kim | 257/13 |
| 2008/0121934 A1* | 5/2008 | Matsuda | 257/192 |
| 2008/0150148 A1* | 6/2008 | Frey et al. | 257/769 |

* cited by examiner

*Primary Examiner* — Minh-Loan T Tran
*Assistant Examiner* — Fazli Erdem
(74) *Attorney, Agent, or Firm* — Muncy, Geissler, Olds & Lowe, P.C.

(57) ABSTRACT

A low contact resistance semiconductor structure includes a substrate, a semiconductor stacked layer, a low contact resistance layer and a transparent conductive layer. The low contact resistance layer is formed on one side of a P-type GaN layer of the semiconductor stacked layer. The low contact resistance layer is formed at a thickness smaller than 100 Angstroms and made of a material selected from the group consisting of aluminum, gallium, indium, and combinations thereof. Through the low contact resistance layer, the resistance between the P-type GaN layer and transparent conductive layer can be reduced and light emission efficiency can be improved when being used on LEDs. The method of fabricating the low contact resistance semiconductor structure of the invention forms a thin and consistent low contact resistance layer through a Metal Organic Chemical Vapor Deposition (MOCVD) method to enhance matching degree among various layers.

13 Claims, 9 Drawing Sheets

LOW CONTACT RESISTANCE SEMICONDUCTOR STRUCTURE AND METHOD OF FABRICATING THE SAME

FIELD OF THE INVENTION

The present invention relates to a structure for reducing resistance and particularly to a low contact resistance semiconductor structure and method of fabricating the same.

BACKGROUND OF THE INVENTION

In semiconductor manufacturing processes, PN interfaces made of different materials can be used on different applications. For instance, gallium nitride (GaN) has been widely used on light emitting diodes (LEDs). However, it is difficult to increase the carrier concentration of P-type GaN, and hence higher conductivity cannot be obtained. As a result, contact resistance between the P-type GaN and conductive later is too high to generate undesirable element characteristic problem, such as low light emission efficiency and high forward voltage. To remedy the aforesaid problem, a general approach is to fabricate a matching layer on the P-type GaN to enhance conductivity with other materials. One conventional technique is to position nickel gold (Ni/Au) material between the P-type GaN and electrode to reduce the resistance of the P-type GaN. Indium tin oxide (ITO) also can be used between the P-type GaN and electrode to reduce the resistance. Indium tin oxide (ITO) has greater transparency and can be easily transmitted by the light from LEDs to achieve higher luminance. However, based on present market requirements, contact resistance of Ni/Au or ITO still is too high, and thus the material still leaves a lot to be desired in terms of matching the P-type GaN.

Moreover, in order to solve the reflection problem of the light generated by the LEDs and emitted to the semiconductor, the surface of the P-type GaN is coarsened during the semiconductor manufacturing process to reduce light reflection. Under such a condition of the semiconductor manufacturing process, the resistance is obviously increased no matter Ni/Au or ITO is used. This is because that the coarsened surface of the P-type GaN has poor contact with Ni/Au or ITO and insufficient consistency to result in higher resistance. Referring to FIGS. 1A and 1B, a coarsened surface 1 is not smooth and flat. Hence when a matching layer is desired to grow, it cannot be fully joined to the coarsened surface 1, and a plurality of holes 2 are generated. As shown in FIG. 1B with an enlarged view, gaps formed between the holes 2 are obviously observed. Due to smaller conductive contact area, transverse electrical conductivity is undesirable, and contact resistance also increases.

SUMMARY OF THE INVENTION

The primary object of the present invention is to provide a material and a structure to reduce contact resistance and solve the matching problem of P-type GaN and conductive structure.

Another object of the invention is to solve the problem of increasing contact resistance caused by coarsened surface adopted in the conventional technique.

To achieve the foregoing objects, the present invention provides a low contact resistance semiconductor structure that includes a substrate, a semiconductor stacked layer, a low contact resistance layer and a transparent conductive layer. The semiconductor stacked layer is formed on one side of the substrate and includes an N-type semiconductor layer and a P-type GaN layer. The low contact resistance layer is formed on one side of the P-type GaN layer of the semiconductor stacked layer and connected thereto. The low contact resistance layer is formed at a thickness smaller than 100 A (Angstrom) and made of a material selected from the group consisting of aluminum, gallium, indium, and combinations thereof. The low contact resistance layer is preferably made of indium. The transparent conductive layer is formed on one side of the low contact resistance layer remote from the P-type GaN layer.

The invention further provides a method for fabricating the low contact resistance semiconductor structure that includes the steps as follows:

S1: Prepare a substrate;
S2: Dispose a semiconductor stacked layer on the substrate; the semiconductor stacked layer includes an N-type semiconductor layer and a P-type GaN layer;
S3: Dispose a low contact resistance layer on one side of the P-type GaN layer of the semiconductor stacked layer; the semiconductor stacked layer is connected to the P-type GaN layer and formed at a thickness smaller than 100 A, and made of a material selected from the group consisting of aluminum, gallium, indium, and combinations thereof;
S4: Dispose a transparent conductive layer on the low contact resistance layer.

By means of the structure set forth above, the low contact resistance layer is interposed between the transparent conductive layer and P-type GaN layer and formed at a thickness smaller than 100 A to form a thin and transparent metal structure. As indium has the contact resistance much lower than ITO and Ni/Au, and thus it can reduce the contact resistance of the P-type GaN layer. When indium is used on LEDs, light emission efficiency improves and forward voltage also decreases.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1A:
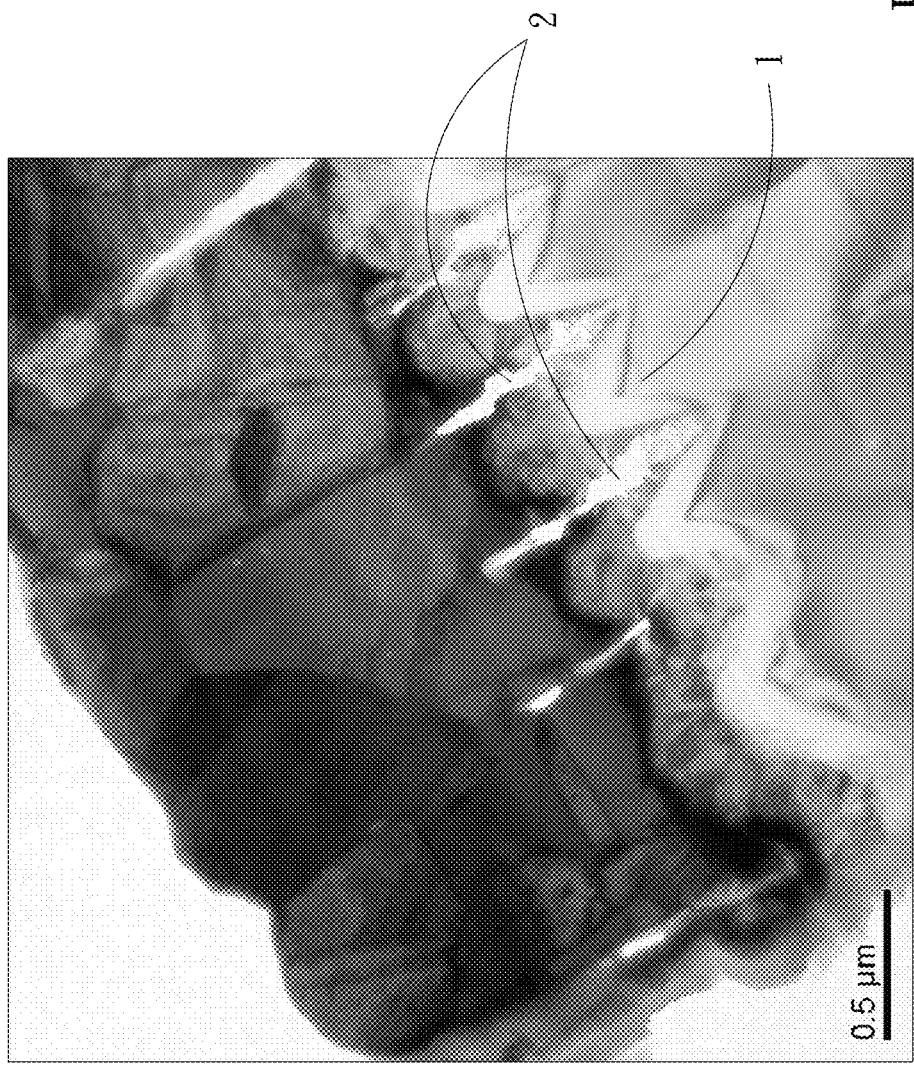
FIG. 1A is a diagram showing a coarsened surface structure of a conventional technique.
Figure 1B:
FIG. 1B is an enlarged diagram showing a coarsened surface structure of a conventional technique.
Figure 2A:
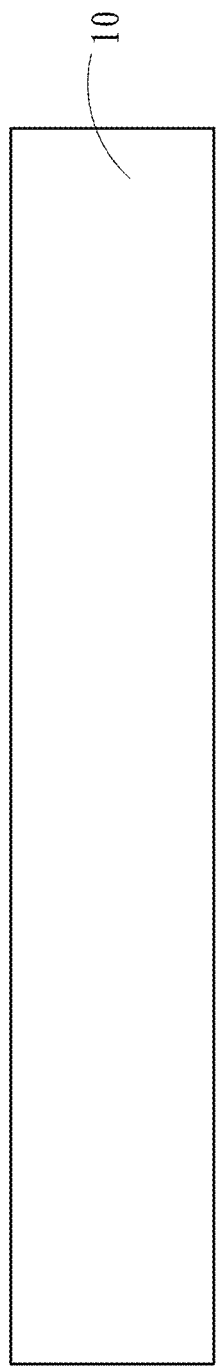
FIGS. 2A through 2E are schematic views of an embodiment of a fabricating process according to the invention.
Figure 2B:
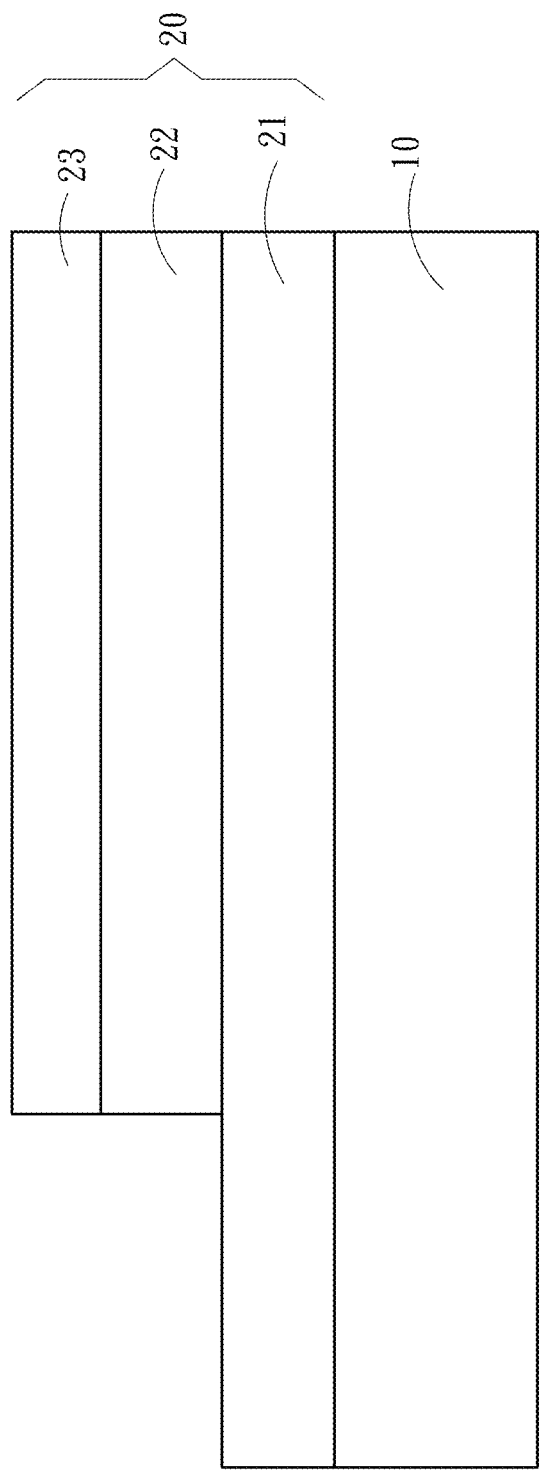
Figure 2C:
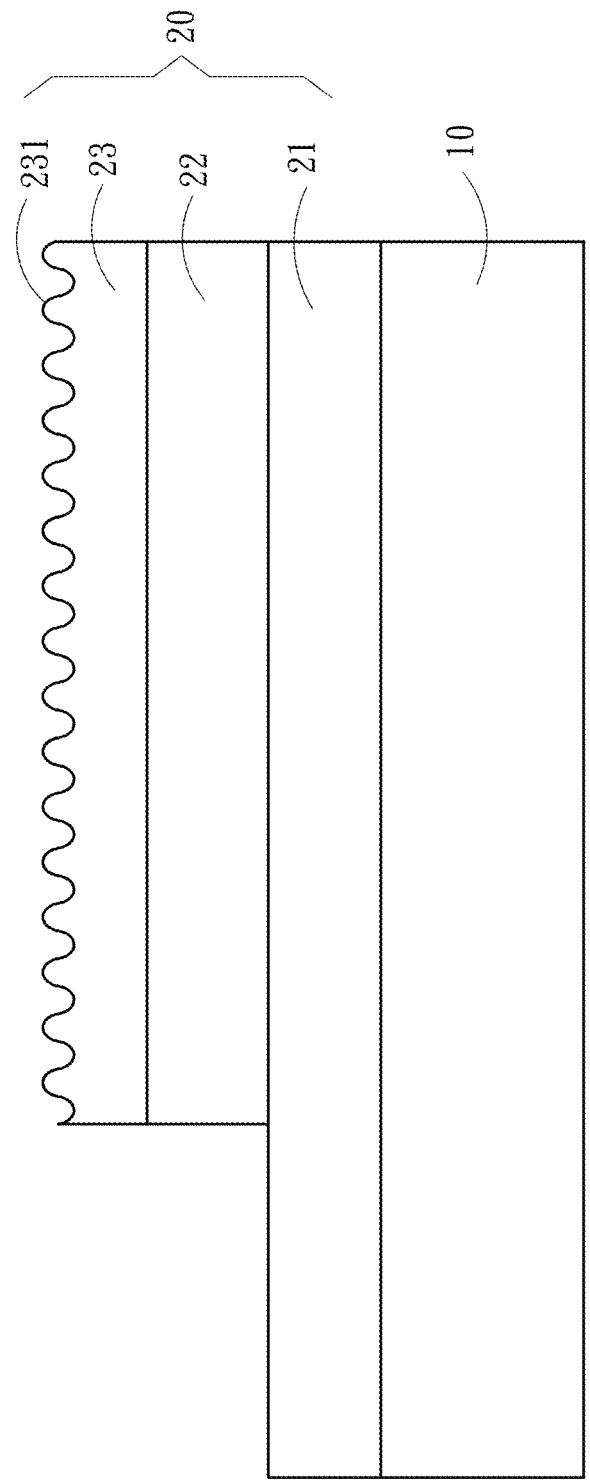
Figure 2D:
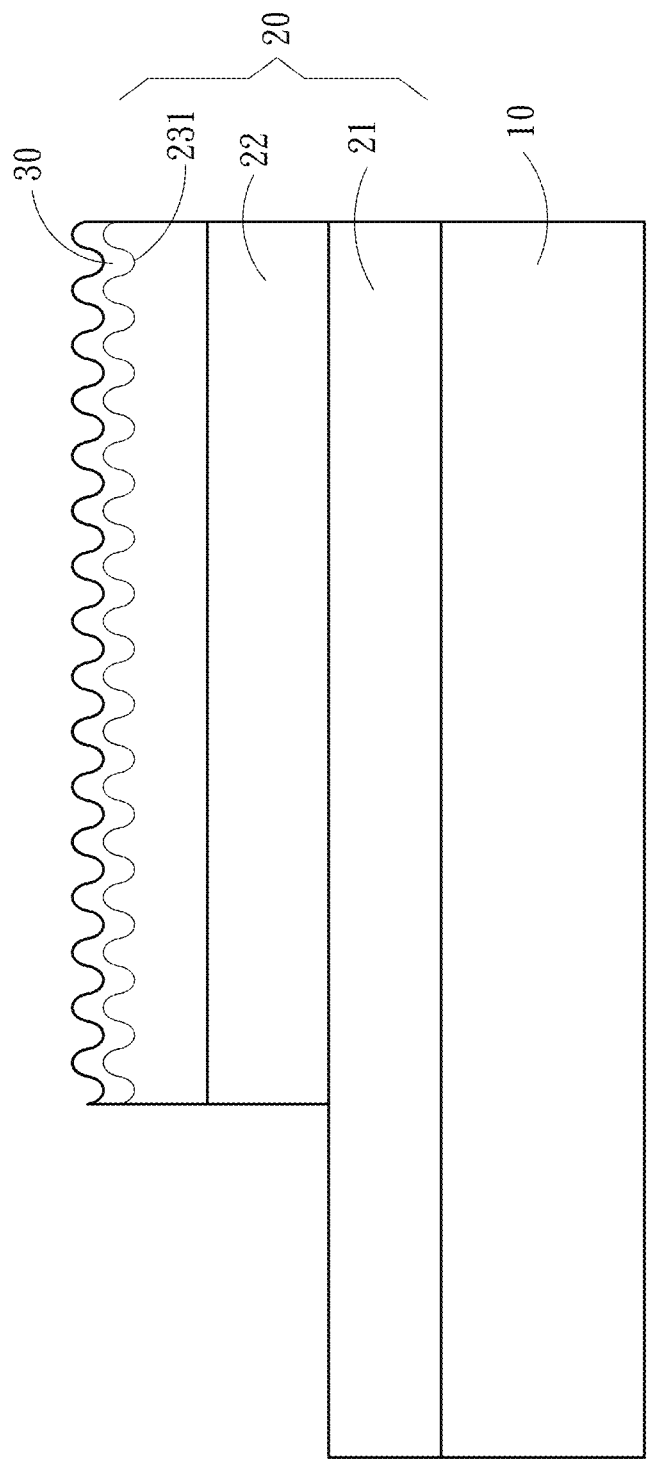
Figure 2E:
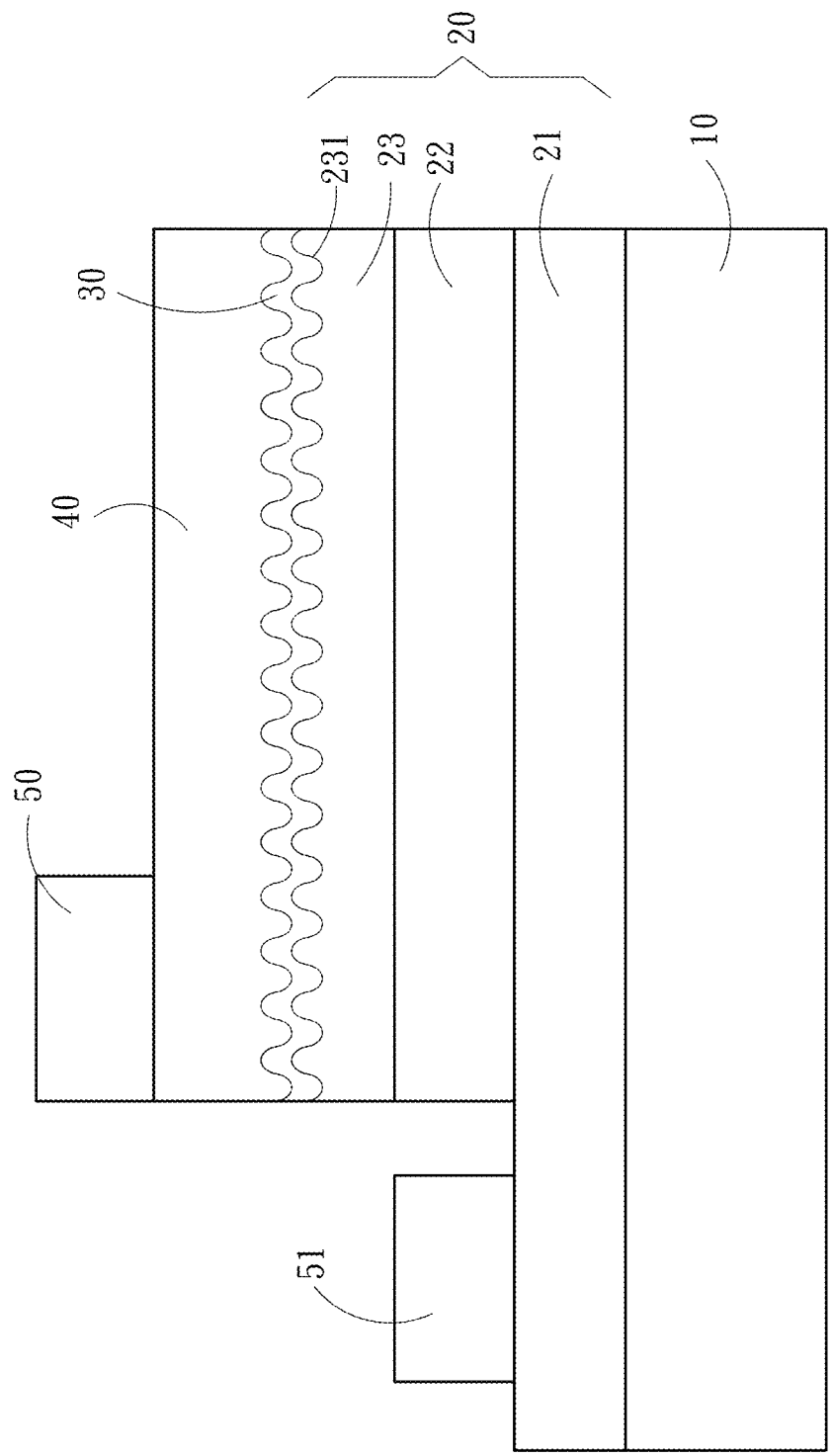

Please refer to FIGS. 2A through 2E for an embodiment of a fabricating process according to the invention with FIG. 2E showing the finished structure. The invention aims to provide a low contact resistance semiconductor structure, a light emitting diode (LED) is taken for discussion in the preferable embodiment below. The low contact resistance semiconductor structure includes a substrate 10, a semiconductor stacked layer 20, a low contact resistance layer 30 and a transparent conductive layer 40. The semiconductor stacked layer 20 is formed on one side of the substrate 10 and includes an N-type semiconductor layer 21, a P-type GaN layer 23 and a light emitting layer 22. The P-type GaN layer 23 is made of P-type GaN and formed on one side of the N-type semiconductor layer 21 remote from the substrate 10, and has an upper surface 231. The light emitting layer 22 is interposed between the N-type semiconductor layer 21 and P-type GaN layer 23. The low contact resistance layer 30 is formed on the upper surface 231 of the P-type GaN layer 23. In this embodiment, the upper surface 231 is treated by grinding and coarsening processes to form an undulant surface. The low contact resistance layer 30 is formed at a thickness smaller than 100 A (Angstrom) and made of a material selected from the group consisting of aluminum, gallium, indium, and combinations thereof. The low contact resistance layer 30 is preferably made of indium. The transparent conductive layer 40 is made of light transparent and conductive material, such as indium tin oxide (ITO), fluorine doped tin oxide (FTO), aluminum zinc oxide, zinc oxide, Ni/Au or combinations thereof. The transparent conductive layer 40 is formed on one side of the low contact resistance layer 30 remote from the P-type GaN layer 23. Take LED as an exemplification for discussion, the transparent conductive layer 40 and N-type semiconductor layer 21 are connected respectively to a first conductive member 50 and a second conductive member 51 to function as input power source for the LED.

More specifically, the low contact resistance layer 30 is preferably grown on the surface of the P-type GaN layer 23 through a Metal Organic Chemical Vapor Deposition (MOCVD) method and fabricated at a temperature between 150-1200° C. Through the MOCVD method, the thickness of the low contact resistance layer 30 can be controlled as desired and is preferably formed between 25-50 A to form an indium thin film or indium cluster on the surface of the P-type GaN layer 23. Through the MOCVD method, the thickness of the low contact resistance layer 30 can even be controlled at 5 A. Such a thin film can enhance transparency of the low contact resistance layer 30. If the thin low contact resistance layer 30 is further formed to become indium cluster, transparency improvement is even more significant. As indium has lower resistance, even if it is formed in clusters, the conductivity would not be affected very much.

Figure 3:
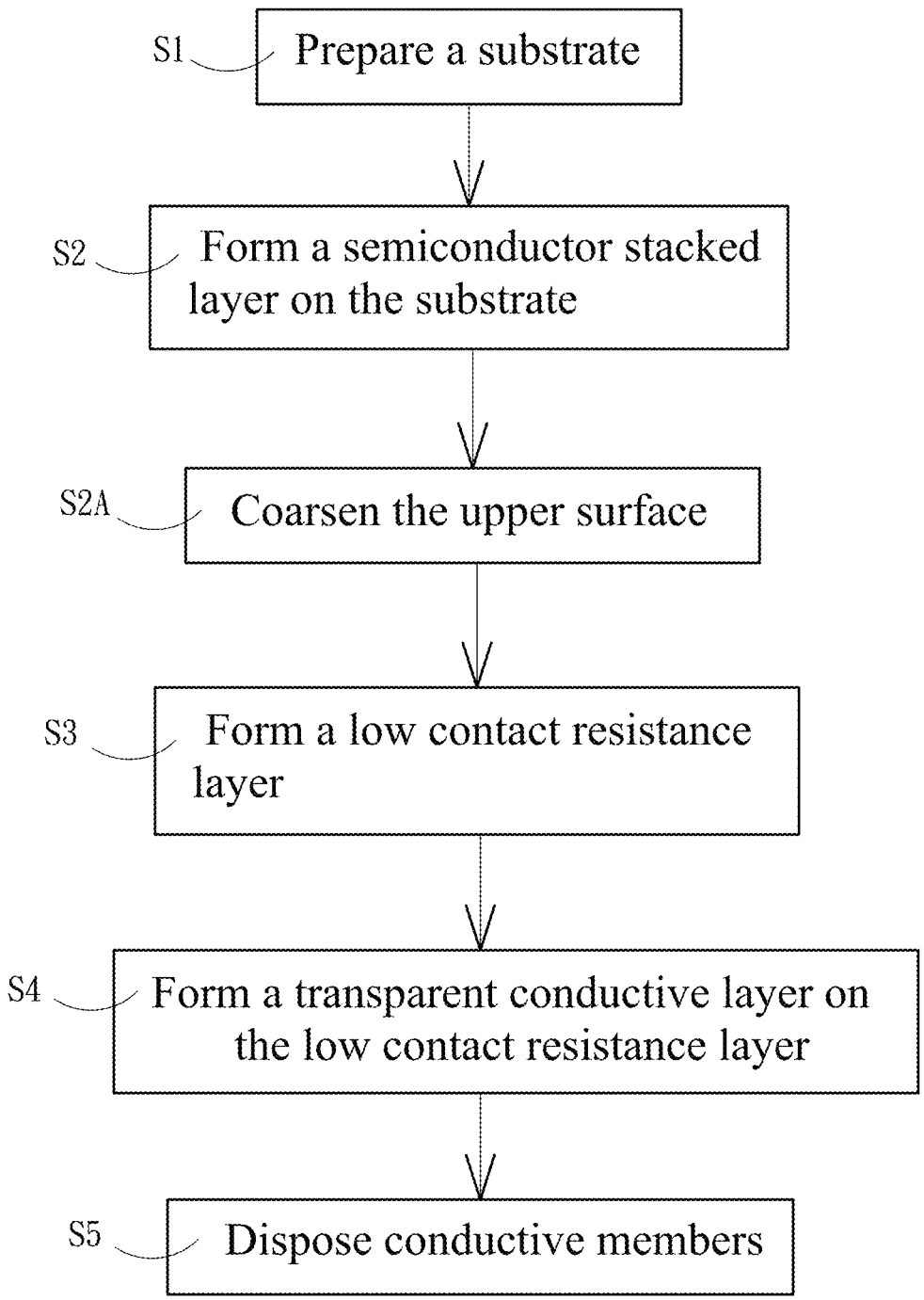
FIG. 3 is a flowchart according to an embodiment of the invention.

In addition, the present invention also provides a method for fabricating the low contact resistance semiconductor structure that includes the steps as follows as shown in FIG. 3:

S1: Prepare a substrate 10;

S2: Dispose a semiconductor stacked layer 20 on the substrate 10, the semiconductor stacked layer 20 includes an N-type semiconductor layer 21, a P-type GaN layer 23 and a light emitting layer 22 interposed between the N-type semiconductor layer 21 and P-type GaN layer 23; the P-type GaN layer 23 is formed on one side of the N-type semiconductor layer 21 remote from the substrate 10 and has an upper surface 231;

S2A: Coarsen the upper surface 231 to form an undulant surface to reduce reflection when light is emitted to the P-type GaN layer 23; coarsening can be done in many ways and is a technique known in the art, thus details are omitted herein;

S3: Dispose a low contact resistance layer 30 on the upper surface 231; the low contact resistance layer 30 is formed at a thickness smaller than 100 A, and made of a material selected from the group consisting of aluminum, gallium, indium, and combinations thereof; more specifically, the low contact resistance layer 30 is preferably formed on the upper surface 231 through the MOCVD method by growing indium via carrier gas carrying indium (Tri-methyl); Through the MOCVD method, the low contact resistance layer 30 can be grown slowly and consistently on the coarsened upper surface 231;

S4: Dispose a transparent conductive layer 40 on the low contact resistance layer 30; the transparent conductive layer 40 is made of transparent and conductive material, and can be ITO, fluorine doped tin oxide (FTO), aluminum zinc oxide, zinc oxide, Ni/Au or combinations thereof; and S5: Dispose a first conductive member 50 and a second conductive member 51 respectively on the transparent conductive layer 40 and N-type semiconductor layer 21 to function as input power source for the LED.

Aside from directly depositing the carrier gas carrying indium on the upper surface 231, at step S3, carrier gas carrying indium and gallium can be formed on the semiconductor stacked layer 20 through the MOCVD method to form a mixture structure, then indium is extracted from the mixture structure through phase separation at high temperature in the MOCVD process, and thereby the low contact resistance layer 30 is obtained. The carrier gas is GaN containing supersaturated indium with mole ratio of indium and gallium greater than 0.2. Such an approach allows the low contact resistance layer 30 to form improved bonding with the upper surface 231.

In another embodiment, GaN containing supersaturated indium can be grown on the semiconductor stacked layer 20, and then the indium is extracted by tempering at high temperature via a furnace tube to form the low contact resistance layer 30.

Figure 4:
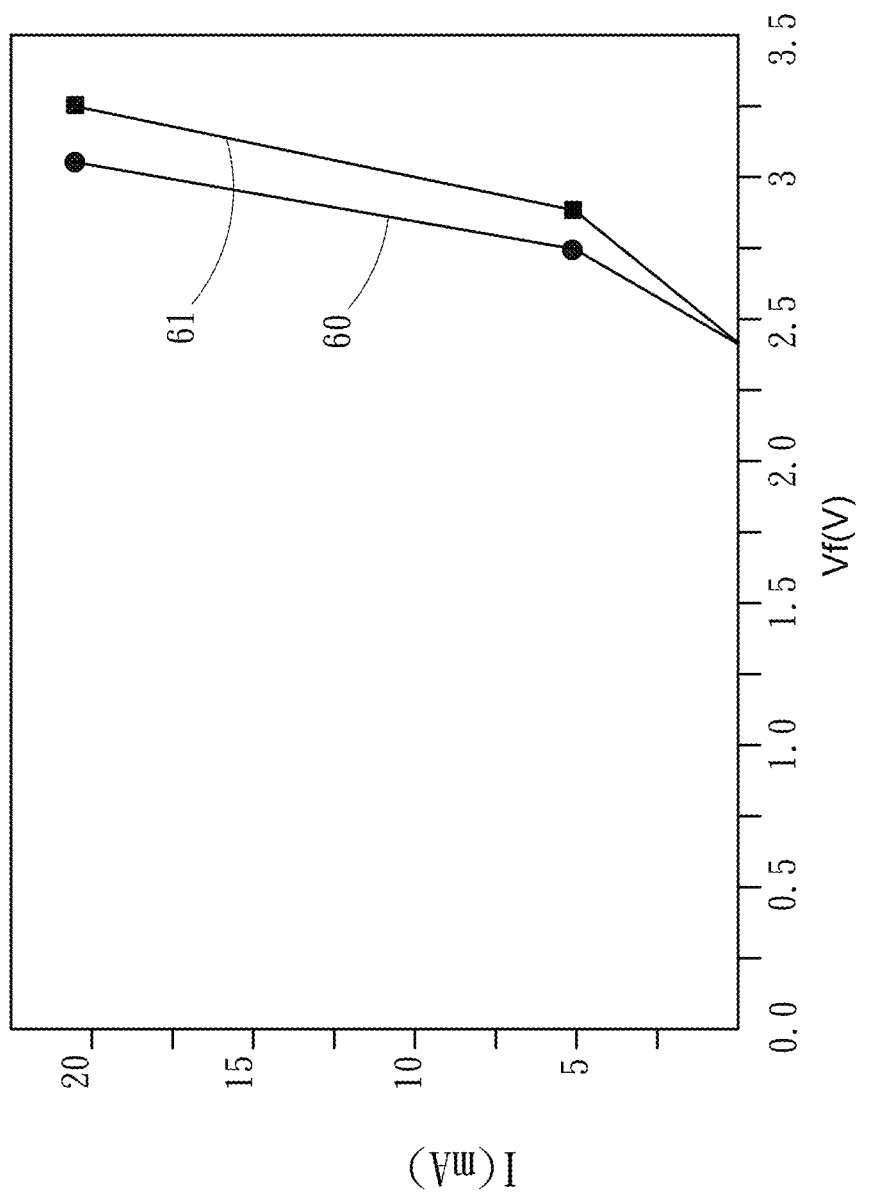
FIG. 4 is a diagram showing relationship between forward voltage and current according to an embodiment of the invention.

Refer to FIG. 4 for the relationship between forward voltage and current according to an embodiment of the invention previously discussed. Comparing the indium contained LED with the low contact resistance layer 30 formed between the transparent conductive layer 40 and the P-type GaN layer 23 with the indium-absent LED, the indium-contained LED has a first forward voltage curve 60 lower than a second forward voltage curve 61 of the indium-absent LED, and thus the indium-contained LED has better light emission efficiency.

As a conclusion, through the low contact resistance layer 30 interposed between the transparent conductive layer 40 and P-type GaN layer 23 and having a thickness smaller than 100 A, a thin and transparent metal structure is formed. Moreover, as indium has the contact resistance much smaller than that of ITO and Ni/Au, the contact resistance of the P-type GaN layer 23 can be reduced. When indium is adopted on LEDs, light emission efficiency can be enhanced and forward voltage can be reduced. Moreover, using the MOCVD method to fabricate the low contact resistance layer 30 can follow the manufacturing process of the semiconductor stacked layer 20 to match with the P-type GaN layer 23 desirably. Through the MOCVD method, the low contact resistance layer 30 has higher consistency and can enhance matching degree with the following structure which is not fabricated through the MOCVD process. The thin film or cluster thus formed provides improved light transparency.

What is claimed is:

1. A low contact resistance semiconductor structure, comprising:
   a substrate;
   a semiconductor stacked layer which includes an N-type semiconductor layer formed on the substrate and a P-type GaN layer formed on the N-type semiconductor layer, the P-type GaN layer including an upper surface;
   a low contact resistance layer which is formed on the upper surface and formed at a thickness between 25 and 50 Angstroms and made of a material selected from the group consisting of aluminum, gallium, indium, and combinations thereof, and a transparent conductive layer formed on one side of the low contact resistance layer remote from the P-type GaN layer.

2. The low contact resistance semiconductor structure of claim 1, wherein the upper surface is an undulant surface.

3. The low contact resistance semiconductor structure of claim 1, wherein the semiconductor stacked layer further includes a light emitting layer interposed between the N-type semiconductor layer and the P-type GaN layer.

4. The low contact resistance semiconductor structure of claim 1, wherein the low contact resistance layer is grown on the upper surface of the P-type GaN layer through a Metal Organic Chemical Vapor Deposition (MOCVD) method.

5. The low contact resistance semiconductor structure of claim 1, wherein the low contact resistance layer is made of indium and formed in an indium thin film or indium cluster on the surface of the P-type GaN layer.

6. The low contact resistance semiconductor structure of claim 1, wherein the transparent conductive layer is made of material selected from the group consisting of indium tin oxide, fluorine doped tin oxide, aluminum zinc oxide, zinc oxide and Ni/Au.

7. A method for fabricating a low contact resistance semiconductor structure, comprising the steps of:
preparing a substrate;
forming a semiconductor stacked layer on the substrate, the semiconductor stacked layer including an N-type semiconductor layer formed on the substrate and a P-type GaN layer formed on the N-type semiconductor layer, the P-type GaN layer including an upper surface;
forming a low contact resistance layer on the upper surface, the low contact resistance layer being formed at a thickness between 25 and 50 Angstroms and made of a material selected from the group consisting of aluminum, gallium, indium, and combinations thereof; and
forming a transparent conductive layer on the low contact resistance layer.

8. The method of claim 7, wherein the step of forming the low contact resistance layer is preceded by a step of treating the upper surface through a coarsening process to form an undulant surface.

9. The method of claim 7, wherein the low contact resistance layer is grown on the upper surface of the P-type GaN layer through a Metal Organic Chemical Vapor Deposition (MOCVD) method.

10. The method of claim 9, wherein the Metal Organic Chemical Vapor Deposition (MOCVD) method grows indium carried by carrier gas on the surface of the P-type GaN layer to form the low contact resistance layer.

11. The method of claim 9, wherein the Metal Organic Chemical Vapor Deposition (MOCVD) method grows supersaturated indium of GaN carried by carrier gas on the low contact resistance layer to extract indium through phase separation at high temperature.

12. The method of claim 11, wherein the carrier gas is GaN including supersaturated indium with mole ratio of indium and gallium greater than 0.2.

13. The method of claim 7, wherein the low contact resistance layer is formed by growing GaN including supersaturated indium on the semiconductor stacked layer and extracting indium from GaN by tempering at high temperature through a furnace tube.

* * * * *